(12) United States Patent
Ramamurthy et al.

(10) Patent No.: US 12,334,950 B2
(45) Date of Patent: Jun. 17, 2025

(54) DYNAMIC RANGE BOOST FOR AMPLIFIERS

(71) Applicant: TEXAS INSTRUMENTS INCORPORATED, Dallas, TX (US)

(72) Inventors: Venkata Ramanan Ramamurthy, Bangalore (IN); Sumit Dubey, Bangalore (IN); Jasjot Singh Chadha, Allen, TX (US); Lokesh Kumar Botcha, New Delhi (IN)

(73) Assignee: Texas Instruments Incorporated, Dallas, TX (US)

( * ) Notice: Subject to any disclaimer, the term of this patent is extended or adjusted under 35 U.S.C. 154(b) by 83 days.

(21) Appl. No.: 18/147,183

(22) Filed: Dec. 28, 2022

(65) Prior Publication Data

US 2024/0223206 A1    Jul. 4, 2024

(51) Int. Cl.
  *H03M 1/46*    (2006.01)
  *H03M 1/18*    (2006.01)
  *H03M 1/66*    (2006.01)

(52) U.S. Cl.
  CPC ............ *H03M 1/46* (2013.01); *H03M 1/18* (2013.01); *H03M 1/66* (2013.01)

(58) Field of Classification Search
  CPC ............ H03M 1/18; H03M 1/46; H03M 1/66
  See application file for complete search history.

(56) References Cited

U.S. PATENT DOCUMENTS

| | | | | |
|---|---|---|---|---|
| 5,880,627 A | * | 3/1999 | Thiel, V | H03F 1/305 330/253 |
| 6,011,415 A | * | 1/2000 | Hahn | G11B 5/596 330/288 |
| 6,356,153 B1 | * | 3/2002 | Ivanov | H03F 3/3028 330/253 |
| 6,366,169 B1 | * | 4/2002 | Ivanov | H03F 3/45219 330/255 |
| 6,653,895 B1 | * | 11/2003 | Douts | H03F 3/45192 330/69 |

(Continued)

OTHER PUBLICATIONS

Bryson, Scott, "Benefits of Class-G and Class-H Boost in Audio Amplifiers," Application Report (SLAA888—Apr. 2019).

*Primary Examiner* — Lam T Mai
(74) *Attorney, Agent, or Firm* — Mandy Barsilai Fernand; Frank D. Cimino

(57) ABSTRACT

Examples of amplifiers and associated control blocks control analog and digital gains of such an amplifier to maintain a ripple voltage at the input/virtual terminals of an internal integrator below an upper limit. Such an example amplifier comprises digital and analog processing blocks. The digital processing block receives a digital audio signal and also includes a digital gain component. The analog processing block includes an analog gain component and an output stage having a supply voltage terminal. A boost controller receives the digital audio signal, and has a digital output and a boost voltage output to output a boost voltage. A digital controller receives the digital audio signal, and has a first digital input coupled to the digital output of the boost controller and a second digital input to receive a measurement value indicative of the outputted boost voltage. Based on its inputs, the digital controller controls the digital and analog gain components.

20 Claims, 3 Drawing Sheets

(56) References Cited

U.S. PATENT DOCUMENTS

| | | | | |
|---|---|---|---|---|
| 7,116,172 B2* | 10/2006 | Siniscalchi | H03F 3/45659 | 330/260 |
| 7,764,210 B2* | 7/2010 | Rentala | H04N 5/148 | 341/144 |
| 8,461,928 B2* | 6/2013 | Yahav | H03G 3/007 | 330/297 |
| 10,187,012 B1* | 1/2019 | Radhakrishnan Kulasekaran | H03F 3/301 | |
| 2002/0180520 A1* | 12/2002 | Ueno | H03F 3/45973 | 330/85 |
| 2004/0008086 A1* | 1/2004 | Sanchez | H03F 3/45192 | 330/260 |
| 2006/0197598 A1* | 9/2006 | Tadeparthy | H03F 3/45192 | 330/257 |
| 2007/0013438 A1* | 1/2007 | Chuang | H03F 3/45968 | 330/9 |
| 2011/0163802 A1* | 7/2011 | Greimel-Rechling | H03F 3/217 | 330/75 |
| 2012/0188018 A1* | 7/2012 | Yahav | H03G 3/007 | 330/278 |
| 2013/0108081 A1* | 5/2013 | Ozaki | H03F 1/0211 | 330/251 |
| 2013/0188808 A1* | 7/2013 | Pereira | H03G 3/3005 | 381/107 |
| 2015/0249466 A1* | 9/2015 | Elyada | H03M 1/70 | 341/144 |
| 2017/0366142 A1* | 12/2017 | Alenin | H03F 3/3069 | |
| 2018/0196454 A1* | 7/2018 | Ivanov | G05F 1/575 | |
| 2019/0165735 A1* | 5/2019 | Fikstvedt | H03F 3/16 | |
| 2019/0181873 A1* | 6/2019 | Ghosh | H03M 1/089 | |
| 2020/0036352 A1* | 1/2020 | Zhu | H03G 3/3005 | |
| 2021/0359647 A1* | 11/2021 | Shaik | H03F 3/45475 | |
| 2024/0007118 A1* | 1/2024 | Bhat | H03F 3/45179 | |

* cited by examiner

DYNAMIC RANGE BOOST FOR AMPLIFIERS

FIELD OF DISCLOSURE

This disclosure relates to dynamic range boosting schemes for amplifiers, and more particularly to schemes in which a gain controller dynamically controls digital and analog gains in response to changes in the audio input and the supply voltage level of the amplifier's output stage.

BACKGROUND

Conventionally, in an amplifier with a digital stage and an analog stage with a Class-D output, dynamic range boost adjusts digital and analog gains to control idle channel noise (ICN) at the Class-D output and also to control power delivery. During idle, the digital gain can be increased and the analog (Class-D) gain decreased to improve ICN. To deliver higher power, the digital gain can be reduced and the analog gain increased, which leads to improved overall dynamic range for the amplifier.

Conventional dynamic range boost architecture assists in reducing noise by changing an input resistance parameter to reduce analog gain. Such conventional approach is generally satisfactory when the voltage supply of the output stage is low enough, such that for fixed feedback and input resistances, the voltage ripple at virtual terminals of a dual-supply integrator amplifier are properly controlled, in which the integrator has a 5 V supply at its input side and a 2 V supply at its output side. This approach, however, is unsatisfactory at higher output stage voltage supply values in which the virtual terminal voltage ripple substantially increases due to higher common mode currents.

A very low ICN target of approximately 4 µV at the Class-D output is desired. Various Class-D elements in the amplifier contribute to ICN, namely, feedback resistor(s), input resistor(s), and the integrator, which contribute approximately 3.2 µV, 1.5 µV and 1.4 µV, respectively, to ICN. To reduce noise from the input resistor(s) and the dual-supply integrator amplifier, the analog gain can be reduced, and to reduce noise from the feedback resistor(s), the resistance thereof can be reduced.

The Class-D driver output stage has a variable, input-dependent voltage supply (e.g., Class-H supply), such that the supply increases for peak input and then remains high for some period of time, based on a discharge rate, even after the input has decreased to a very low magnitude. This presents a problem in that conventional dynamic range boost acts to reduce the gain in response to decreased input, which at times, occurs even when the supply is still high. This causes higher virtual input terminal voltage ripple, which leads to non-linearity at the output of the integrator and elsewhere in the signal chain. To ensure proper operation of transistors in the integrator, the swing range of the voltage at the virtual terminals of the integrator needs to be controlled.

Voltage ripple at the input of the integrator (i.e., at its virtual terminals) is maximum at the lowest analog (Class-D) gain and highest voltage supply and when the input is zero (i.e., idle channel) or at the zero-crossing point of input signal. Decreasing the analog gain, increases the DC content of the integrator input voltage, and lowering the feedback resistance increases the AC content of the integrator input voltage. These actions tend to lead to higher virtual terminal ripple and relatively high distortion from the integrator. While it is possible to lower the AC content, and thus reduce virtual terminal ripple, by increasing the capacitance of the capacitors associated with the integrator, such solution increases the area on the chip required for the amplifier circuitry.

One previous approach to moderate voltage increase at the integrator's virtual input terminals is to add a common mode feedback (CMFB) amplifier to limit the voltage swing at the virtual input terminals by sinking excess common mode current. A drawback to this approach is that the CMFB amplifier adds differential current noise at the virtual input terminals of the integrator, which noise gets multiplied by the feedback resistors respectively coupling the outputs of the integrator to the virtual input terminals, and thus appears at the Class-D output of the amplifier. This added noise can be around 6 or 7 µV. Another drawback is that the CMFB amplifier typically requires a relatively high supply of approximately 5.2 V, which increases power consumption. The addition of a CMFB amplifier also increases the overall footprint of the larger amplifier. Thus, this approach comes with the additional cost of increased noise, increased power consumption, and increased chip area to accommodate the CMFB amplifier.

Thus, a better solution to these issues is needed.

SUMMARY

In an example, an amplifier comprises a digital processing block, a digital-to-analog converter (DAC), an analog processing block, a boost controller, and a digital controller. The digital processing block has a digital audio input and a digital audio output. The digital audio input is adapted to receive a digital audio signal, and includes a digital gain component. The DAC has a digital input coupled to the digital audio output of the digital processing block. The DAC has analog outputs, and is configured to convert the digital audio signal to an analog audio signal. The analog processing block has analog inputs respectively coupled to the analog outputs of the DAC. The analog processing block includes an analog gain component and an output stage having a supply voltage terminal. The boost controller is configured to receive the digital audio signal, and has a digital output and a boost voltage output configured to output a boost voltage. The digital controller is configured to receive the digital audio signal. The digital controller has first and second digital inputs, in which the first digital input is coupled to the digital output of the boost controller and the second digital input is configured to receive a measurement value indicative of the boost voltage. The digital controller is configured to control the digital and analog gain components.

In an example, an amplifier comprises a digital block, an analog block, and a control block. The digital block is configured to receive a digital audio signal, and includes a digital gain component configured to adjust the digital gain of the digital audio signal. The digital block is further configured to output a modulated digital audio signal. The analog block is coupled to the digital block and configured to receive an analog audio signal derived from the modulated digital audio signal. The analog block includes an analog gain component configured to adjust the analog gain of the analog audio signal. The analog block further includes an output stage having a supply voltage terminal. The control block is configured to: determine a level of the digital audio signal received by the digital block, calculate an expected boost voltage based on the determined level of the digital audio signal, output an actual boost voltage for the supply voltage terminal of the output stage, measure the actual boost voltage, and control the digital and analog gain components based on the determined level of the digital audio signal, the expected boost voltage, and the measured actual boost voltage.

In an example, an amplifier comprises digital and analog blocks, as well as a control block. The digital block is configured to receive a digital audio signal, includes a digital gain component configured to adjust the digital gain of the digital audio signal, and is further configured to output a modulated digital audio signal. The analog block is coupled to the digital block and configured to receive an analog audio signal derived from the modulated digital audio signal. The analog block includes an analog gain component configured to adjust the analog gain of the analog audio signal, and further includes an output stage having a supply voltage terminal. The control block is configured to: compare a level of the digital audio signal to an audio threshold for a current analog gain setting; and increase the analog gain a first set amount and decrease the digital gain the first set amount when (i) the level of the digital audio signal is greater than the audio threshold for the current analog gain setting or (ii) a maximum of a calculated boost voltage and an actual boost voltage output to the supply voltage terminal is greater than a maximum supported voltage for the output stage at the current analog gain setting.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
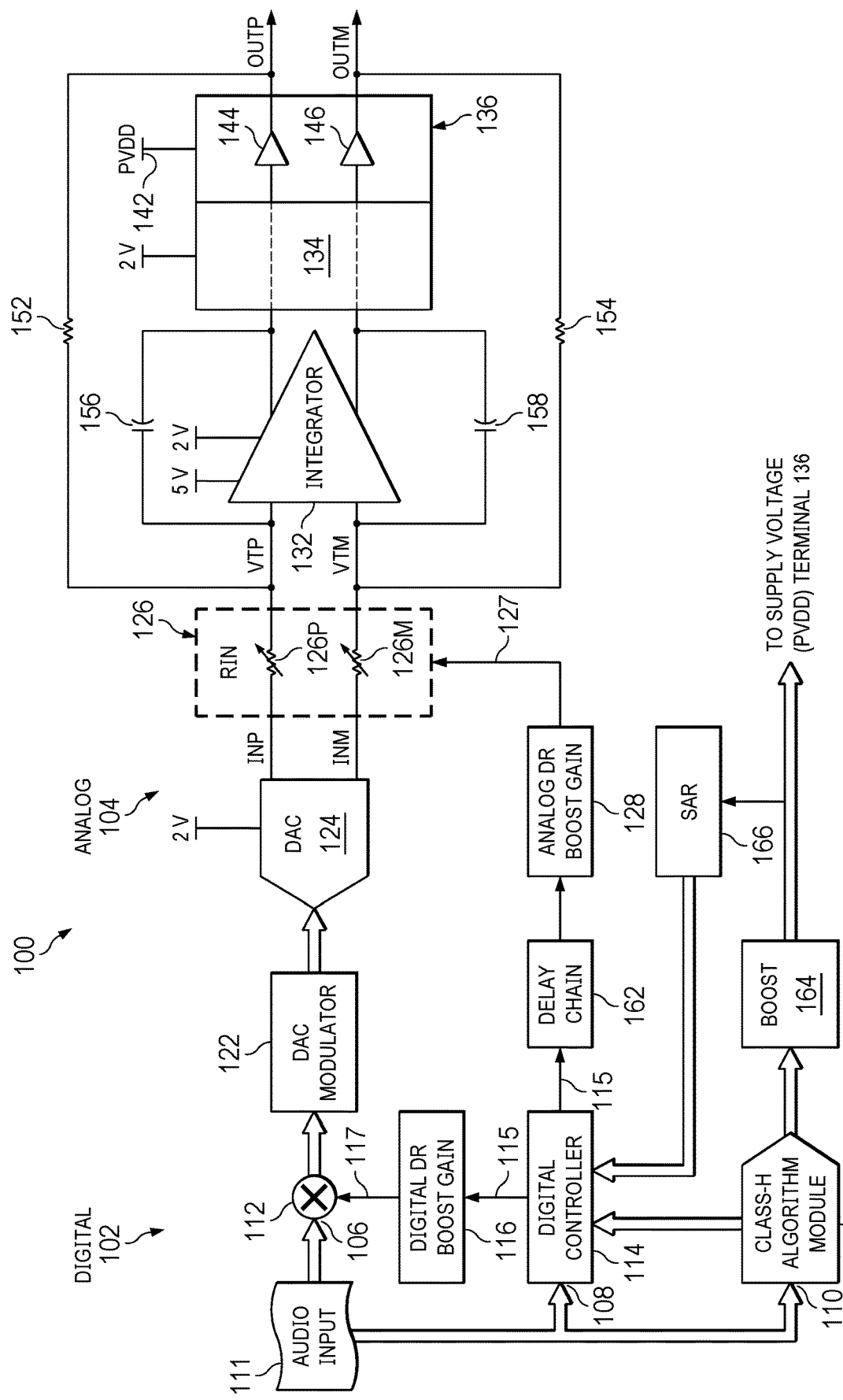
FIG. 1 is a diagram of an example amplifier having digital and analog signal processing blocks.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

Amplifiers and control components thereof are provided in which analog and digital gains are adjusted based on audio input level, as well as the supply voltage of the output stage of the amplifier, to maintain ripple voltage at the input/virtual terminals of an internal integrator below an upper limit or within a specified range. The maximum virtual terminal voltage limit is known, as is the corresponding output stage supply voltage that causes the same. Thus, control is implemented using a Class-H boost module. Based on the audio input level, the Class-H algorithm module determines a corresponding output stage supply voltage, which is input to a boost component that outputs a boost voltage that is applied to the supply voltage terminal of the output stage. A successive-approximation-register (SAR) analog-to-digital converter (ADC) measures the boost voltage output by the boost component and communicates that measurement to a digital controller, which is coupled directly to a digital gain component and coupled to an analog gain component through a look-ahead delay. When the audio input level exceeds an audio threshold for the current gain setting or when the output stage supply voltage exceeds the maximum supported supply level for the current analog gain setting, analog gain is increased and digital gain is decreased. When the audio input level falls below the audio threshold for the current analog gain setting, analog gain is decreased and digital gain is increased after a hold time period, if the output stage supply voltage is supported for the new, decreased analog gain setting. The audio threshold may be set according to the particular application of the amplifier.

FIG. 1 is a diagram of example amplifier 100 that includes a digital processing block 102 and an analog processing block 104. Digital processing block 102 includes digital audio inputs 106, 108 and 110 at which a digital audio signal (Audio Input) 111 is received by a multiplier circuit 112, digital controller 114 and a Class-H algorithm module 118, respectively. In another example, digital audio signal 111 may be input at a single input to digital processing block 102 and then distributed internally to component inputs 106, 108 and 110. Digital audio signal 111 may be obtained from an analog signal using analog-to-digital processing circuitry not shown.

Within digital processing block 102, digital controller 114 executes a control program (described below with reference to FIG. 3) to control the digital and analog gains of amplifier 100, and outputs a digital control signal 115 to a digital gain component 116 and an analog gain component 128. Digital gain component 116 outputs a digital gain value embodied in a digital gain adjustment signal 117 to multiplier circuit 112, which multiplies the digital audio signal 111 with the digital gain value to generate a digital output signal that is input to a digital-to-analog converter (DAC) modulator 122, which modulates the digital output signal as is known in the art. The modulated digital audio signal, which is a digital code, is output by DAC modulator 122 and delivered to an input of a DAC 124. A digital-code-to-analog-current converter of DAC 124 is configured to convert the digital code to a differential analog current signal, the components of which are delivered to a current-to-voltage converter of DAC 124, which converts the differential analog current signal to a differential analog voltage signal having components INP and INM. DAC 124 may be coupled to a 2 V supply as shown.

Analog processing block 104 includes a variable resistance component (RIN) 126, which includes a first variable resistive element 126P in the signal path of INP and a second variable resistive element 126M in the signal path of INM. The resistances of first and second variable resistive elements 126P and 126M are controlled by an analog gain adjustment signal 127 output by an analog gain component 128. First and second variable resistive elements 126P and 126M are coupled to respective virtual terminals of an integrator amplifier (integrator) 132, which may be a first of a series of integrators forming a loop filter within amplifier 100. VTP and VTM represent components of the ripple voltage at the respective virtual terminals of integrator 132. The input side of integrator 132 has a first supply voltage terminal that is adapted to be coupled to a first supply voltage, which may be 5 V. The output side of integrator 132 has a second supply voltage terminal that is adapted to be coupled to a second supply voltage, which may be 2 V. These are exemplary supply voltage values, although the first supply voltage is higher than the second supply voltage.

Downstream in the main signal chain is a pulse width modulator (PWM) 134 that generates, from its input signals, PWM signals to drive a Class-H output stage 136, the latter of which is coupled to a supply voltage terminal 142, which is configured to receive a supply voltage PVDD, which is variable and includes different boost voltage levels, to accommodate the output voltages that are to be driven. Class-H output stage 136 may include drivers 144 and 146 that respectively output components OUTP and OUTM of an output analog differential signal. OUTP is fed back to the to INP/VTP signal path through first feedback resistor 152, and OUTM is fed back to the INM/VTM signal path through second feedback resistor 154.

Integrator 132 is configured with local feedback in the form of capacitive elements 156 and 158. Feedback capacitive element 156 is coupled between one output of integrator 132 and its input for VTP. Feedback capacitive element 158 is coupled between the other output of integrator 132 and its input for VTM.

Digital control signal 115, which is output by digital controller 114 to digital gain component 116, is also output to a delay chain 162, which holds digital control signal 115 for a period of time and then outputs such signal to analog gain component 128. Delay chain 162 functions to control the timing of digital and analog gain adjustments made to amplifier 100 to account for delay through the audio signal channel.

Class-H algorithm module 118 receives digital audio signal 111, determines its level, and outputs a boost control signal to a boost component 164 to output a boost voltage to be applied to supply voltage terminal 142 of output stage 136. The level of the boost voltage output by boost component 164 is variable, as it depends on the level of digital audio signal 111. Class-H algorithm module 118 also outputs the boost control signal to digital controller 114. The boost control signal is a digital representation of the boost voltage calculated by Class-H algorithm module 118, i.e., the expected boost voltage. The expected boost voltage may be slightly different than the actual boost voltage output by boost component 164. There may be a delay between the output of the expected boost voltage and the output of the actual boost voltage, and these voltages may be slightly different. Collectively, Class-H algorithm module 118 and boost component 164 may be considered a boost controller.

A successive-approximation-register (SAR) 166, which is a type of analog-to-digital converter (ADC), measures the level of the actual boost voltage output by boost component 164 and communicates a digital measurement value indicative of the measured level to digital controller 114. Based on the measurement value (representative of the actual boost voltage), the expected boost voltage as calculated by Class-H algorithm module 118, and digital audio signal 111, digital controller 114 generates and outputs digital control signal 115.

Figure 3:
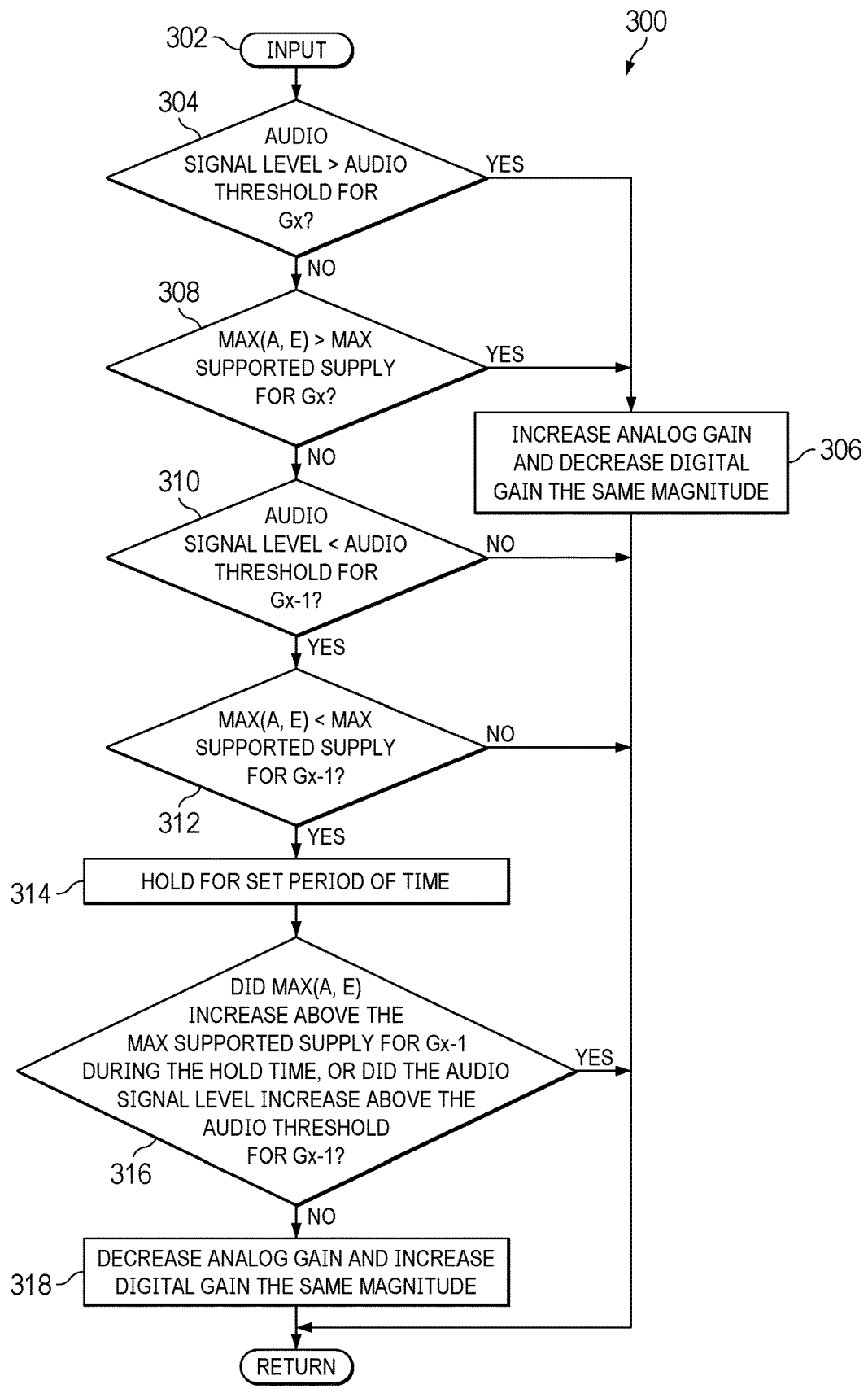
FIG. 3 is a flow diagram of an example process of implementing an example dynamic range boosting scheme in an amplifier.

In response to digital control signal 115, digital gain component 116 outputs digital gain adjustment signal 117, which contains a digital gain value, to multiplier 112 to adjust the digital gain of amplifier 100. Analog gain component 128 also responds to digital control signal 115, which is received via delay chain 162, to output analog gain adjustment signal 127 to adjust the resistances of variable resistive elements 126P and 126M and hence the analog gain of amplifier 100. The operative coupling of digital and analog gain components 116 and 128 via digital controller 114, its digital control signal 115, and delay chain 162 enables the digital and analog gains to be changed together while keeping overall gain approximately constant. An example method of operation of digital controller 114 to control digital and analog gain components 116 and 128 to adjust digital and analog gains is shown in FIG. 3. Digital controller 114, Class-H algorithm module 118, boost component 164, and SAR 116 collectively form a control block for amplifier 100.

Amplifier 100 is configured with multiple gain settings, each setting having an associated digital gain and an associated analog gain. Moreover, each analog gain setting has a corresponding audio threshold against which digital audio signal 111 is compared. For each analog gain setting, the maximum supported supply voltage PVDD without saturation of the virtual terminals of integrator 132 is computed from the design of amplifier 100.

Figure 2:
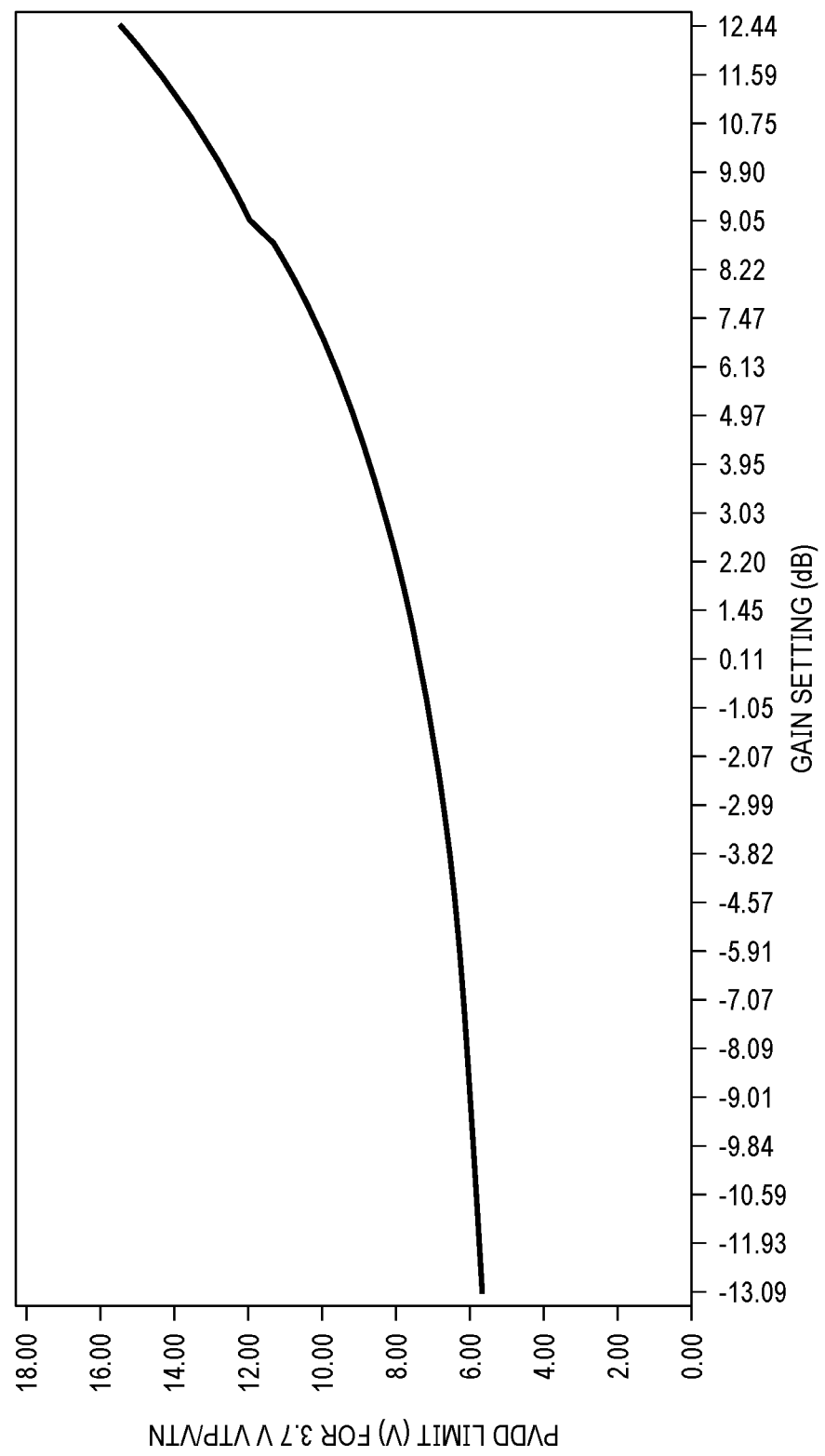
FIG. 2 shows a graph of voltage supply for a 3.7 V virtual terminal voltage limit (maximum-to-minimum swing) with respect to gain setting.

FIG. 2 shows a graph 200 of supply voltage PVDD for a 3.7 V virtual terminal voltage limit with respect to gain setting. In the illustrated example, the PVDD limit varies from just below 6 V to just below 16 V, which spans multiple gain settings, ranging from about −13.09 dB to about 12.44 dB.

FIG. 3 is a flow diagram of an example process 300 of implementing an example dynamic range boosting scheme. In operation 302, a digital audio signal is input to an amplifier, e.g., amplifier 100. With the digital audio signal having been received by the amplifier, a digital controller, e.g., digital controller 114 of amplifier 100, executes the remainder of process 300. In operation 304, the digital audio signal is compared to an audio threshold for the current analog gain setting (Gx) to determine if the level of the digital audio signal is greater than that audio threshold. If so (Yes at 304), then the analog gain is increased a specific magnitude and the digital gain is decreased that same magnitude in operation 306, after which the process returns to operation 302. In an example, the specific magnitude is 0.5 dB. If the level of the digital audio signal is not greater than the audio threshold for Gx (No at 304), in operation 308, a maximum of two values is compared against the maximum supported supply voltage for the current analog gain setting (Gx).

That is, if the maximum (max) of the expected boost voltage as calculated by Class-H algorithm module 118(E) and the actual boost voltage output by boost component 164(A), denoted as max(E, A), is greater than the maximum supported supply voltage for Gx (Yes at 308), the process continues with operation 306 in which the analog gain is increased and the digital gain is decreased the same magnitude. Thereafter, the process returns to operation 302. If max(A, E) is not greater than the maximum supported supply voltage for Gx (No at 308), the level of the digital audio signal is compared to an audio threshold for a next lower analog gain setting (Gx-1) in operation 310 to determine if the digital audio signal level is less than this audio threshold.

If the digital audio signal level is not less than this this audio threshold (No at 310), the process returns to operation 302. If the digital audio signal level is less than this audio threshold, in operation 312, it is determined if max(A, E) is less than the maximum supported supply voltage for Gx-1. If not (No at 312), the process returns to operation 302. If max(A, E) is less than the maximum supported supply voltage for Gx-1 (Yes at 312), the process goes into a hold time period in operation 314. In an example, the hold time is 100 ms, although other suitable hold times may be used. In operation 316, it is determined if max(A, E) has increased above the maximum supported supply voltage for Gx-1 during the hold time period, or whether the audio signal level increased above the Gx-1 audio threshold. If so (Yes at 316), the process returns to operation 302. If the result of the comparison made at operations 312 and 310 did not change during the hold time period (No at 316), the analog gain is decreased and the digital gain increased the same magnitude, e.g., 0.5 dB. Thereafter, the process returns to operation 302.

FIG. 3 depicts one possible set of operations. In some examples, not all operations need be performed. Moreover, some operations may be combined into a single operation, and/or some operations may be performed substantially simultaneously. Additional and/or alternative operations may be performed. The audio thresholds for respective analog gain settings are set between an upper range and a lower range of the input signal. The upper range is mapped to the highest digital gain and the lowest analog gain, and the lower range is mapped to the highest analog gain and the lowest digital gain. For example, for an input signal having a range of −120 dB to 0 dB, the upper range may be between 0 dB and −24 dB and the lower range may be between −48 dB and −120 dB. In this example, the audio thresholds may be steps of 0.5 dB within the range of −24 dB and −48 dB and are mapped to respective analog gain settings.

Amplifiers and control components thereof are provided in which analog and digital gains are adjusted based on audio input level, as well as the supply voltage of the output stage of the amplifier, to maintain ripple voltage at the input/virtual terminals of an internal integrator below an upper limit or within a specified range. Example gain controllers configured and operated as described above are able to maintain virtual terminal ripple, i.e., the VTP/VTM signal, at or below approximately 3 V, within the range of <3.6 V at a PVDD of approximately 5.5 V, as well as consistently meet the lowest noise industry standard of 4 μV at low idle channel power. Example control components provided herein are compact and thus have only a very small area impact.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors etc.), and/or one or more sources (such as voltage and/or current sources) may instead include only the semiconductor elements within a single physical device (i.e., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Unless otherwise stated, "about," "approximately," or "substantially" preceding a value means+/−10 percent of the stated value.

Modifications of the described examples are possible, as are other examples, within the scope of the claims. Moreover, features described herein may be applied in other environments and applications consistent with the teachings provided.

What is claimed is:

1. An amplifier comprising:
   a digital processing block having a digital audio input and a digital audio output, the digital processing block configured to receive a digital audio signal at the digital audio input;
   a digital-to-analog converter (DAC) having a digital input coupled to the digital audio output of the digital processing block, the DAC having analog outputs;
   an analog processing block having analog inputs respectively coupled to the analog outputs of the DAC, the analog processing block configured to receive an analog audio signal at the analog inputs, the analog audio signal derived from the digital audio signal; and
   a digital controller configured to receive the digital audio signal and configured to control a digital gain of the digital audio signal and an analog gain of the analog audio signal based on the digital audio signal.

2. The amplifier of claim 1, further comprising:
   a boost controller having a audio input, a digital output, and a boost voltage output, wherein the boost controller is configured to receive the digital audio signal at the audio input and configured to determine a level of the digital audio signal and, based on the determined level of the digital audio signal, output a boost control signal at the digital output and output a boost voltage at the boost voltage output, the boost control signal indicative of the boost voltage.

3. The amplifier of claim 2, wherein the digital controller includes first and second digital inputs, the first digital input coupled to the digital output of the boost controller, and the second digital input configured to receive a measurement value indicative of a boost voltage generated at the boost voltage output of boost controller.

4. The amplifier of claim 3, wherein the digital processing block further includes a multiplier circuit and a digital gain component, the multiplier circuit configured to receive the digital audio signal through the digital audio input, the multiplier circuit having a digital gain input coupled to the digital gain component.

5. The amplifier of claim 4, wherein the analog processing block further includes an input resistance element and an analog gain component, the input resistance element coupled to the analog outputs of the DAC and having an analog gain input coupled to the analog gain component.

6. The amplifier of claim 5, further comprising:
   a successive-approximation-register analog-to-digital converter (SAR ADC) coupled to the boost voltage output of the boost controller and configured to measure the boost voltage, the SAR ADC having a digital output coupled to the second digital input of the digital controller to provide the digital controller with the measurement value indicative of the boost voltage; and
   a delay element coupled between the digital controller and the analog gain component.

7. The amplifier of claim 6, wherein the digital controller is configured to output a digital control signal to the digital gain component and to the delay element, the digital control signal is based on one or more of the digital audio signal, the boost control signal and the measurement value indicative of the boost voltage, and the delay element is configured to output the digital control signal to the analog gain component.

8. The amplifier of claim 7, wherein, in response to the digital control signal, the digital gain component is configured to output a digital gain adjustment signal to adjust digital gain of the digital audio signal by a first amount, and the analog gain component is configured to output an analog gain adjustment signal to adjust analog gain of an analog audio signal by a second amount.

9. The amplifier of claim 8, wherein the first and second amounts are of equal magnitude and opposite in sign.

10. The amplifier of claim 8, further comprising an integrator having voltage input terminals coupled to the input resistance element, wherein the digital gain of the digital audio signal and the analog gain of the analog audio signal are adjusted to maintain a magnitude of a differential voltage at the voltage input terminals below a threshold.

11. An amplifier comprising:
a digital block configured to receive a digital audio signal, the digital block configured to adjust a digital gain of the digital audio signal, the digital block further configured to output a modulated digital audio signal;
an analog block coupled to the digital block and configured to receive an analog audio signal derived from the modulated digital audio signal, the analog block configured to adjust an analog gain of the analog audio signal; and
a control block coupled to the digital block and the analog block, and configured to:
determine a level of the digital audio signal received by the digital block,
calculate an expected boost voltage based on the determined level of the digital audio signal,
output an actual boost voltage,
measure the actual boost voltage, and
control the digital block and the analog block based on one or more of the determined level of the digital audio signal, the expected boost voltage, and the measured actual boost voltage.

12. The amplifier of claim 11, wherein the control block includes a Class-H algorithm module configured to determine the level of the digital audio signal, calculate the expected boost voltage based on determined level of the digital audio signal, and output a boost control signal indicative of the expected boost voltage.

13. The amplifier of claim 12, wherein the control block further includes a boost component configured to output the actual boost voltage based on the expected boost voltage.

14. The amplifier of claim 13, wherein the control block further includes a successive-approximation-register analog-to-digital converter (SAR ADC) configured to measure the actual boost voltage and output a digital measurement value indicative of the measured actual boost voltage.

15. The amplifier of claim 14, wherein the control block further includes a digital controller configured to receive the digital audio signal, the boost control signal, and the digital measurement value, the digital controller configured to control a digital gain component in the digital block and an analog gain component in the analog block, the digital gain component configured to adjust the digital gain of the digital audio signal, and the analog gain component configured to adjust the analog gain of the analog audio signal.

16. The amplifier of claim 15, further comprising a delay element coupled between the digital controller and the analog gain component, wherein the digital controller is further configured to output a digital control signal to the digital gain component and to the delay element, the digital control signal based on the digital audio signal, the boost control signal, and the digital measurement value.

17. An amplifier comprising:
a digital block configured to receive a digital audio signal and configured to output a modulated digital audio signal;
an analog block coupled to the digital block and configured to receive an analog audio signal derived from the modulated digital audio signal, the analog block further including an output stage having a supply voltage terminal; and
a control block coupled to the digital block and the analog block, and configured to:
compare a level of the digital audio signal to an audio threshold for a current analog gain setting; and
increase an analog gain of the analog audio signal by a first set amount and decrease a digital gain of the digital audio signal by the first set amount when (i) the level of the digital audio signal is greater than the audio threshold for the current analog gain setting or (ii) a maximum of a calculated boost voltage and an actual boost voltage output provided to the supply voltage terminal is greater than a maximum supported supply voltage for the output stage at the current analog gain setting.

18. The amplifier of claim 17, wherein the control block is further configured to:
decrease the analog gain of the analog audio signal by a second set amount and decrease the digital gain of the digital audio signal by the second set amount when (iii) the level of the digital audio signal is less than an audio threshold for a lower analog gain setting and one of: (iv) the maximum of the calculated boost voltage and the actual boost voltage output to the supply voltage terminal is less than a maximum supported voltage supply for the output stage at the lower analog gain setting for a hold time period, or (v) the level of the digital audio signal did not increase above the audio threshold for the lower analog gain setting after the hold time period.

19. The amplifier of claim 18, wherein the first set amount is the same as the second set amount.

20. The amplifier of claim 18, wherein the lower analog gain setting is a next lower analog gain setting with respect to the current analog gain setting.

* * * * *